United States Patent [19]
Nakashima et al.

[11] Patent Number: 5,989,981
[45] Date of Patent: Nov. 23, 1999

[54] METHOD OF MANUFACTURING SOI SUBSTRATE

[75] Inventors: Sadao Nakashima; Terukazu Ohno; Toshiaki Tsuchiya; Tetsushi Sakai, all of Kanagawa; Shinji Nakamura, Tokyo; Takemi Ueki, Kanagawa; Yuichi Kado, Tokyo; Tadao Takeda, Kanagawa, all of Japan

[73] Assignee: Nippon Telegraph and Telephone Corporation, Japan

[21] Appl. No.: 08/886,876

[22] Filed: Jul. 2, 1997

[30] Foreign Application Priority Data

Jul. 5, 1996 [JP] Japan .................................. 8-176304

[51] Int. Cl.$^6$ ................................. H01L 21/265
[52] U.S. Cl. ........................ 438/459; 438/695; 257/347
[58] Field of Search .................................. 438/695, 459; 257/347

[56] References Cited

FOREIGN PATENT DOCUMENTS

| | | |
|---|---|---|
| 0595233A | 5/1994 | European Pat. Off. . |
| 0675534 | 10/1995 | European Pat. Off. . |
| 2581795 | 11/1986 | France . |

OTHER PUBLICATIONS

"Analysis of color variations in bonded SOI wafers", by P.J. Clapis et al., IEEE, 1993, pp. 66–67.

"Silicon on insulator material technology", by M. Bruel, Electronics Letters, Jul. 6, 1995, vol. 31, No. 14, pp. 1201–1202.

"A method of Detecting Hot Spots on Semiconductors using Liquid Crystals", by J. Hiatt, 19th Annual Proceedings Reliability Physics 1981, pp. 130–133.

"Anomalous temperature effects of oxidation stacking faults in silicon", by S.M. Hu, Applied Physics Letters, vol. 27, No. 4, Aug. 15, 1975, pp. 165–167.

"Hydrogen annealed silicon–on–insulator", by N. Sato et al., Applied Physics Letters, vol. 65, No. 15, Oct. 10, 1994, pp. 1924–1926.

"Experimental 0.25–$\mu$m Gate Fully Depleted CMOS/SIMOX Process Using a New Two–Step LOCOS Isolation Technique", by T. Ohno et al., IEEE, vol. 42, No. 8, Aug. 1995.

"Investigation on High–Speed Performance of 0.1–$\mu$m–Gate, Ultrathin–Film CMOS/SIMOX", by Y. Omura et al., IEICE Trans. Electron., vol. E75–C. No. 12, Dec. 1992, pp. 1491–1496.

"Crystallographic defect studies in SIMOX material thinned by sacrificial oxidation", by L.F. Giles et al., Nuclear Instruments and Method in Physics Research B84 (1994) pp. 242–247.

*Primary Examiner*—Charles Bowers
*Assistant Examiner*—David S. Blum
*Attorney, Agent, or Firm*—Blakely Sokoloff Taylor & Zafman

[57] ABSTRACT

A method of manufacturing an SOI substrate uses an SOI substrate having a first single-crystal silicon layer, an insulating layer formed on the first single-crystal silicon layer, and a second single-crystal silicon layer formed on the insulating layer. The surface of the second single-crystal silicon layer is thermally oxidized. The second single-crystal silicon layer is controlled to have a predetermined thickness by removing the thermally oxidized surface. This step controlling the second single-crystal silicon layer to have a predetermined thickness includes the step of eliminating, by annealing, a stacking fault formed by the thermal oxidation.

12 Claims, 8 Drawing Sheets

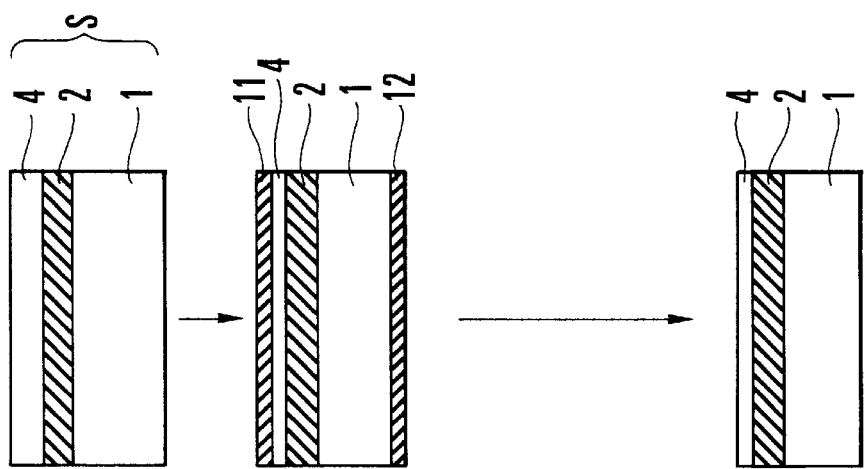
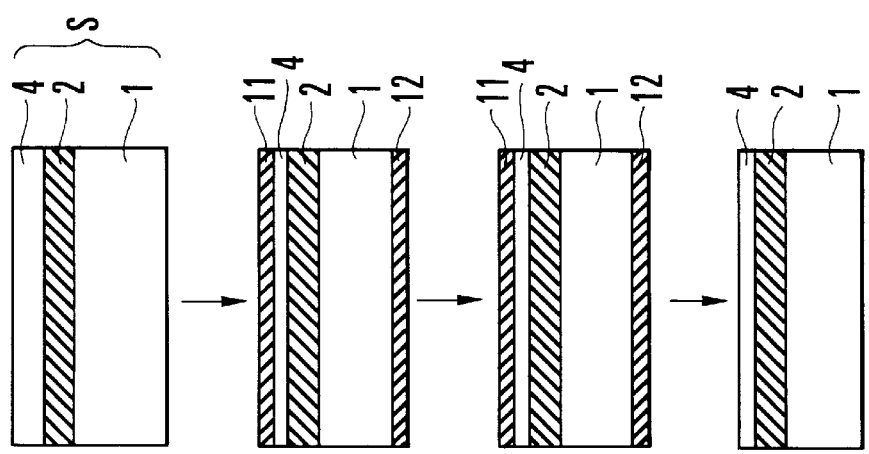

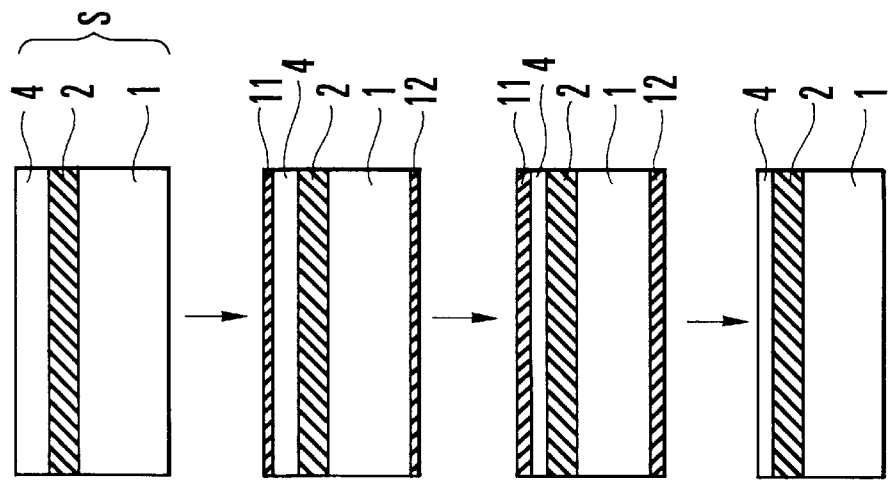
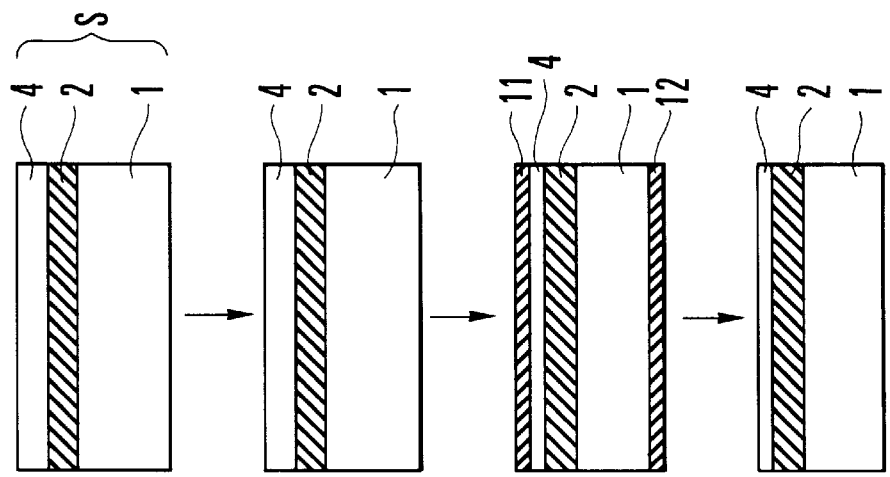

○ : NORMAL MOS TRANSISTOR SET
× : ABNORMAL MOS TRANSISTOR SET

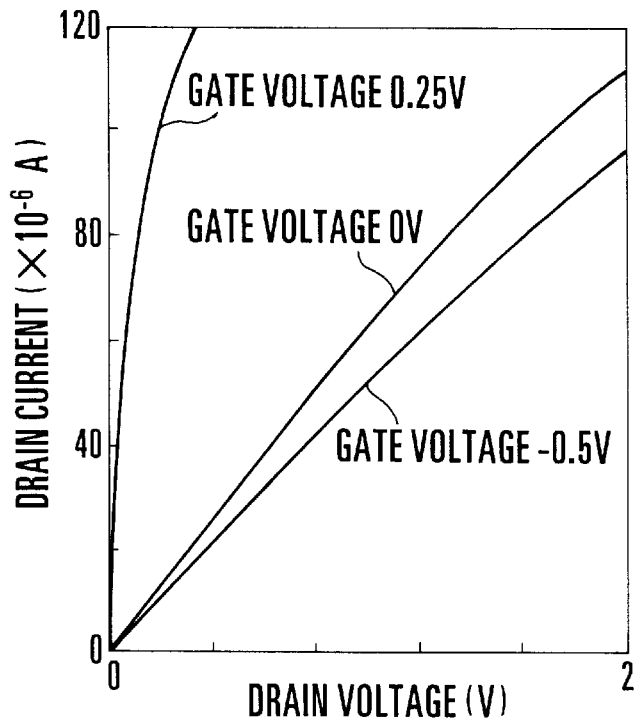
F I G. 10 A
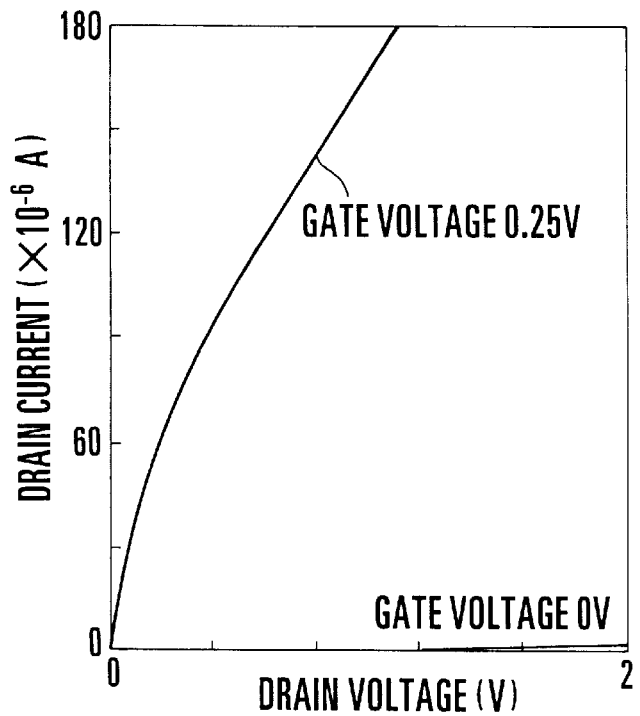
F I G. 10 B

METHOD OF MANUFACTURING SOI SUBSTRATE

BACKGROUND OF THE INVENTION

The present invention relates to a method of manufacturing an SOI substrate having a surface single-crystal silicon layer with a desired thickness.

Various structures have been conventionally proposed as semiconductor integrated circuits, and it is known that forming various devices in a silicon layer on an insulating layer is more advantageous than forming devices on a single-crystal silicon substrate in terms of device characteristics and isolation between devices; i.e., a parasitic capacitance can be reduced and devices can be completely isolated. From this viewpoint, methods of forming semiconductor integrated circuits on an SOI (Silicon On Insulator) substrate instead of a single-crystal silicon substrate become popular recently.

These SOI substrate manufacturing methods are roughly classified into a method of SIMOX (Separation by Implanted OXygen) and a method using wafer bonding.

The method of manufacturing a SIMOX substrate will be described first. In this method, a heavily doped oxygen layer is formed by implanting oxygen ions to a predetermined depth of a single-crystal silicon substrate. Annealing is then performed at a high temperature of about 1,300° C. for a few hours to change the heavily doped oxygen layer into an electric insulating buried oxide layer. Subsequently, the oxide layer formed on the silicon substrate surface during the annealing is removed to form a buried oxide layer midway along the direction of thickness of the silicon substrate. The obtained SOI substrate has a single-crystal silicon layer with a predetermined thickness formed on the buried oxide layer.

The SOI substrate manufacturing method using wafer bonding will be described next. Note that the SOI substrate manufacturing method using wafer bonding includes two methods.

The first SOI substrate manufacturing method is as follows. Two single-crystal silicon substrates are prepared, and one of the silicon substrates is oxidized to form an oxide layer on the surface. The other silicon substrate is overlapped and bonded such that the oxide layer is sandwiched between the two substrates, thereby forming a structure consisting of an oxide layer, a first single-crystal silicon layer, an oxide layer (buried oxide layer), and a second single-crystal silicon layer (substrate silicon) in this order from the substrate surface.

Thereafter, the oxide layer is removed by polishing, and the first single-crystal silicon layer is polished to decrease its thickness, thereby forming a structure consisting of a surface single-crystal silicon layer, a buried oxide layer, and substrate silicon.

It is also possible to additionally perform AcuThin$^{Th}$ process (1993 IEEE SOI Conference Proc., 1993, pp. 66–67) after the polishing. If this is the case, a structure consisting of a surface single-crystal silicon layer, a buried oxide layer, and a substrate silicon layer in this order from the substrate surface is formed.

The second SOI substrate manufacturing method using wafer bonding will be described below. This manufacturing method does not use the polishing as described above (Japanese Patent Laid-Open No. 5-211128 and M. Bruel, Electronics Lett., 1995, Vol. 31, pp. 1201–1203).

In the first stage of this method, hydrogen ions or ions of a rare gas are implanted into an oxidized single-crystal silicon substrate to form fine bubbles in the substrate. In the second stage, this substrate is tightly adhered to another single-crystal silicon substrate. In the third stage, the adhered substrates are heat-treated to separate into two substrates from the bubble portion, forming a structure consisting of a surface single-crystal silicon layer, a buried oxide layer, and substrate silicon in this order from the substrate surface.

SOI substrates are manufactured as described above. The single-crystal silicon layer formed on the oxide layer has an effect on the characteristics of a semiconductor device such as an LSI including MOS transistors formed in this region. Therefore, it is necessary to accurately determine the thickness of the single-crystal silicon layer.

To accurately determine the thickness of the single-crystal silicon layer formed on the oxide layer, a method called sacrificial oxidation is proposed. In this sacrificial oxidation method, a surface single-crystal silicon layer having a thickness equal to a difference between a known surface single-crystal silicon layer thickness of an SOI substrate and a desired layer thickness in device design is changed into a thermal oxide layer by thermal oxidation, and then only this thermal oxide layer is removed. This sacrificial oxidation method is widely used since the method is superior in controllability and reproducibility.

Unfortunately, the use of the sacrificial oxidation method is unpreferable because of an increase in leakage current of a device formed in an SOI substrate, particularly leakage current between the source and drain of a MOS transistor.

This will be explained more specifically with reference to FIG. 9. FIG. 9 shows a structure having an n-type MOS transistor formed in a surface single-crystal silicon layer of a SIMOX substrate. Referring to FIG. 9, a buried oxide layer 2 is formed on substrate silicon 1, and a silicon semiconductor region having a source region 8, a drain region 9, and a body region 10 is formed on the buried oxide layer 2. This semiconductor region is surrounded by a device isolation region 3 consisting of such as a silicon oxide layer. A source electrode 16 is connected to the source region 8, and a drain electrode 17 is connected to the drain region 9. A gate electrode 6 is formed on the body region 10 via a gate silicon oxide layer 5, and a silicon oxide layer 7 and a PSG film 15 are formed on the gate electrode 6. In this structure, the source electrode 16 is grounded, the drain electrode 17 is connected to a positive power supply, and a positive bias is applied to the gate electrode 6.

An n-type MOS transistor with the above construction is fabricated as follows. A surface single-crystal silicon layer on a SIMOX substrate is changed into a thermal oxide layer to a depth of 132 nm from the surface by using the sacrificial oxidation method. Thereafter, this thermal oxide layer is removed, and transistors including an n-type MOS transistor are formed in the residual 50-nm thick surface single-crystal silicon layer. Note that the gate length of this MOS transistor formed in this example is 0.25 $\mu$m, and the transistor is designed so that normally-off electrical characteristics are obtained.

It is known that a leakage current of an LSI device formed in an SOI substrate by the sacrificial oxidation method readily increases. For example, when the gate length of MOS transistors constituting an LSI device is about 0.5 $\mu$m or less, a leakage current (to be referred to as an S/D leakage current hereinafter) particularly between the source and drain easily increases. Consequently, a standby current of the LSI device also increases.

FIGS. 10A and 10B show the drain current-drain voltage characteristics of an n-type MOS transistor set (a device in which about 20,000 MOS transistors were connected parallel to each other) according to FIG. 9 fabricated in a surface single-crystal silicon layer of a SIMOX substrate.

FIG. 10A shows the drain current-drain voltage characteristics when a large S/D leakage current was generated. FIG. 10B shows the drain current-drain voltage characteristics in a normal case. Note that sacrificial oxidation in each of FIGS. 10A and 10B was performed at 1,150° C.

Comparing the characteristics shown in FIGS. 10A and 10B when gate voltage $V_G=0$ (V) shows that a larger drain current than in FIG. 10B flows in FIG. 10A. That is, this type of the SIMOX substrate cannot be applied to a low-power LSI.

SUMMARY OF THE INVENTION

It is, therefore, a principal object of the present invention to provide an SOI substrate manufacturing method capable of suppressing a leakage current between the source and drain of a MOS transistor formed on an SOI substrate.

It is another object of the present invention to provide an SOI substrate manufacturing method capable of removing stacking faults formed in an SOI substrate.

To achieve the above objects, the present inventors have found that an S/D leakage current generated when a MOS transistor is formed on an SOI substrate is caused by a stacking fault produced when a single-crystal silicon layer is formed to have a predetermined thickness on an insulating film in the SOI substrate.

A stacking fault described above will be explained in detail with reference to FIGS. 6A and 6B. A MOS transistor shown in FIGS. 6A and 6B is formed in a surface single-crystal silicon layer with a predetermined thickness formed on an insulating film, i.e., in a surface single-crystal silicon layer formed by controlling the thickness of the surface single-crystal silicon layer by the sacrificial oxidation method.

FIG. 6A shows a plain view of a MOS transistor with a gate length of 0.25 μm. FIG. 6B shows only a region where a stacking fault is produced (where an S/D leakage current is generated) in a section taken along a line 6B—6B in FIG. 6A. FIG. 6B was obtained by a transmission electron microscope, and a liquid crystal method (Liquid Crystal Analysis, "Hiatt, IRPS, 1981, pp. 130–133") was used to pinpoint the stacking fault.

As is apparent from FIG. 6B, a stacking fault 18 at a region where an S/D leakage current is generated is clearly shown in a body region 10. Referring to FIG. 6A, this stacking fault 18 (indicated by the broken lines) extends through the body region 10 from a source 8 to a drain 9. When the distance between the source 8 and the drain 9 is shortened by decreasing the gate length, the probability of the stacking fault 18 penetrating the body region 10 increases.

Also, when the distance between the source 8 and the drain 9 is shortened, heavily doped impurities (phosphorus or arsenic in an n-type MOS transistor and boron in a p-type transistor) present in the source 8 and the drain 9 easily interdiffuse via the stacking fault 18. That is, it is considered that the stacking fault 18 forms a low-resistance path extending in the body 10 from the source 8 and the drain 9, and this causes an S/D leakage current.

On the basis of the above analysis, the present invention prevents the generation of an S/D leakage current on the basis of the fact that a stacking fault produced in the sacrificial oxidation step used to control a surface single-crystal silicon layer of an SOI substrate to have a predetermined thickness is the cause of an S/D leakage current of a MOS transistor formed in the surface single-crystal silicon layer.

The mechanism of this stacking fault generation is considered as follows. That is, during the course of thermal oxidation, i.e., sacrificial oxidation, if the thermal oxide layer is formed in the direction of thickness of a surface single-crystal silicon layer, excess silicon atoms are produced when the oxide layer is formed. This excess silicon atoms enter and settle in a comparatively stable place in the singe-crystal silicon to produce a stacking fault.

The process of this crystal defect generation will be described in more detail below. In order for stacking faults to be produced, it is necessary that:

(A) fine generation nuclei be present in single-crystal silicon or on its surface;

(B) excess interstitial silicon atoms be present in single-crystal silicon, and the number of these interstitial atoms be sufficient to be captured by the fine generation nuclei in (A); and (C) the interstitial silicon atoms be captured by the generation nuclei to thereby make the system thermochemically stable.

Also, in order for the stacking faults not to disappear, it is necessary that:

(D) the interstitial silicon atoms be thermochemically stably captured by the generation nuclei or the stacking faults.

In consideration of the above conditions, the present inventors have invented a method which creates an environment in which no stacking faults are produced in a surface single-crystal silicon layer formed on an oxide layer, thereby preventing the generation of an S/D leakage current of a MOS transistor formed in the surface single-crystal silicon layer.

According to one aspect of the present invention, therefore, there is provided a method of manufacturing an SOI substrate, comprising the steps of using an SOI substrate having a first single-crystal silicon layer, an insulating layer formed on the first single-crystal silicon layer, and a second single-crystal silicon layer formed on the insulating layer, thermally oxidizing a surface of the second single-crystal silicon layer, and controlling the second single-crystal silicon layer to have a predetermined thickness by removing the thermally oxidized surface, wherein the step of controlling the second single-crystal silicon layer to have a predetermined thickness comprises the step of eliminating, by annealing, stacking faults formed by the thermal oxidation.

The present invention will be described in detail below with reference to the accompanying drawings.

BRIEF DESCRIPTION OF THE DRAWINGS

FIGS. 1A to 1D are partial sectional views of an SOI substrate showing processing steps according to one embodiment of the present invention;

FIGS. 2A to 2C are partial sectional views of an SOI substrate showing processing steps according to another embodiment of the present invention;

FIGS. 3A to 2D are partial sectional views of an SOI substrate showing processing steps according to still another embodiment of the present invention;

FIGS. 4A to 4D are partial sectional views of an SOI substrate showing processing steps according to still another embodiment of the present invention;

FIGS. 10A and 10B are graphs showing the drain current-drain voltage characteristics of n-type MOS transistor sets fabricated in a surface single-crystal silicon substrate of a SIMOX substrate.

DESCRIPTION OF THE PREFERRED EMBODIMENTS

Figure 5A:
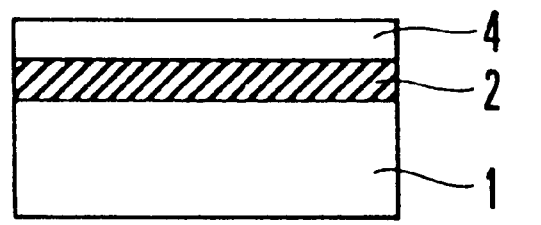
FIGS. 5A to 5D are partial sectional views of ai SOI substrate showing processing steps according to till another embodiment of the present invention.

FIGS. 1A to 1D to FIGS. 5A to 5D show embodiments of a method of manufacturing an SOI substrate according to the present invention.

First, the manufacturing method shown in FIGS. 1A to 1D will be described below.

In FIG. 1A, an SOI substrate S having substrate silicon 1 as a base, a buried oxide layer 2, and a surface single-crystal silicon layer 4 is formed by a known SIMOX or wafer bonding technique.

In FIG. 1B, this SOI substrate S is subjected to sacrificial oxidation. Various known methods can be used as this sacrificial oxidation method. For example, the sacrificial oxidation is performed in an atmosphere containing dry oxygen as a main constituent at a temperature lower than 1,230° C., or an atmosphere containing water vapor as a main constituent at a temperature lower than 1,300° C. in an oxidation furnace. Alternatively, the sacrificial oxidation is performed by burning oxygen and hydrogen in an oxidation furnace at a temperature lower than 1,300° C. (to be referred to as pyrogenic oxidation hereinafter).

By the above sacrificial oxidation, a portion of the surface single-crystal silicon layer 4 is thermally oxidized to form a surface thermal oxide layer 11. The thickness of this surface oxide layer 11 is controlled so that the thickness of the remaining surface single-crystal silicon layer 4 has a desired value. This control can be performed with a considerably high accuracy by the use of current technologies. Note that the substrate silicon 1 is also partially oxidized to form a surface thermal oxide layer 12 by this sacrificial oxidation. However, this portion has no connection with the present invention.

In FIG. 1C, annealing as a high-temperature heat treatment is performed in an atmosphere containing an inert gas as a main constituent at a temperature of 1230° C. to lower than the melting point of silicon. This annealing characterizes the present invention. That is, the annealing is performed at the temperature described above so that interstitial silicon atoms are thermochemically hard to be kept captured by stacking faults or stacking fault production nuclei. Consequently, stacking faults produced in the surface single-crystal silicon layer by the sacrificial oxidation disappear.

Note that the annealing temperature can also be changed during the treatment as long as the temperature is 1,230° C. or higher.

In FIG. 1D, the surface thermal oxide layers 11 and 12 are removed. Thereafter, MOS transistors or LSI devices including MOS transistors are fabricated in this SOI substrate. Note that the fabrication of the MOS transistors or the LSI devices is done by using, e.g., a method disclosed in a reference (Ohno et al., IEEE Trans. Electron Devices, 1995, vol. 42, pp. 1481–1486).

The manufacturing method shown in FIGS. 2A to 2C will be described below.

In FIG. 2A, as in the step shown in FIG. 1A, an SOI substrate S having substrate silicon 1, a buried oxide layer 2, and a surface single-crystal silicon layer 4 is formed by SIMOX or wafer bonding.

A portion shown in FIG. 2B characterizes the present invention and shows a step of performing sacrificial oxidation for the SOI substrate S. This sacrificial oxidation step may be performed in an atmosphere containing dry oxygen as a main constituent. The dry oxygen may be within a temperature range from a high temperature of 1,230 deg. C or more to a temperature that is lower than the melting point of silicon. The high temperature of 1,230 deg. C or more is a temperature at which interstitial silicon atoms produced in the sacrificial oxidation step are thermochemically hard to be captured by stacking fault production nuclei.

Alternatively, the sacrificial oxidation step may be performed in an atmosphere containing water vapor as a main constituent. The water vapor may be within a temperature range from a high temperature of 1,300 deg. C or more to a temperature that is lower than the melting point of silicon. The high temperature of 1,300 deg. C or more is a temperature at which interstitial silicon atoms produced in the sacrificial oxidation step are thermochemically hard to be captured by stacking fault production nuclei. Alternatively, the sacrificial oxidation step is accomplished by performing pyrogenic oxidation within a temperature range from 1,300° C. or more, at which interstitial silicon atoms produced in the sacrificial oxidation step are thermochemically hard to be captured by stacking fault production nuclei, to a temperature lower than the silicon melting point. Consequently, the surface single-crystal silicon layer 4 is partially oxidized to form a surface thermal oxide layer 11. Note that the substrate silicon 1 is also partially oxidized to form a surface thermal oxide layer 12 by this sacrificial oxidation. However, this portion has no connection with the present invention.

Note also that when a SIMOX substrate is used as an SOI substrate, an oxide layer formed during annealing is sometimes already formed on the surface of the substrate. If this is the case, the step shown in FIG. 2B can also be performed without removing this oxide layer.

The thickness of the surface thermal oxide layer 11 is controlled so that the thickness of the residual surface single-crystal silicon layer 4 has a desired value.

In FIG. 2C, the surface thermal oxide layers 11 and 12 are removed. Thereafter, MOS transistors or LSI devices are fabricated in this substrate. The fabrication of the MOS transistors or the LSI devices is done following the same procedure as in the manufacturing method shown in FIGS. 1A to 1D.

The manufacturing method shown in FIGS. 3A to 3D will be described below.

In FIG. 3A, as in the step shown in FIG. 1A, an SOI substrate having substrate silicon 1, a buried oxide layer 2, and a surface single-crystal silicon layer 4 is formed by SIMOX or wafer bonding.

FIG. 3B is a portion characterizing the present invention. That is, annealing as a heat treatment is performed for the SOI substrate S in an atmosphere containing hydrogen as a main constituent within a temperature range from 1,000° C. or more to a temperature lower than the melting point of silicon. This annealing decreases the number of fine stacking fault generation nuclei present in the single-crystal silicon or on its surface.

In FIG. 3C, sacrificial oxidation for the surface single-crystal silicon layer 4 of the SOI substrate is performed in an atmosphere containing oxygen or water vapor as a main constituent or by pyrogenic oxidation.

Consequently, the surface single-crystal silicon layer 4 is partially oxidized to form a surface thermal oxide layer 11. The thickness of this oxide layer is controlled so that the thickness of the residual surface single-crystal silicon layer 4 has a desired value. Note that the substrate silicon 1 is also partially oxidized to form a surface thermal oxide layer 12 by this sacrificial oxidation. However, this portion has no connection with the present invention.

In FIG. 3D, the surface thermal oxide layers 11 and 12 are removed. Thereafter, MOS transistors or LSI devices are fabricated in this substrate. The fabrication of the MOS transistors or the LSI devices is done following the same procedure as in the manufacturing method shown in FIGS. 1A to 1D.

The sacrificial oxidation step shown in FIG. 3C is more effectively performed in an atmosphere containing dry oxygen as a main constituent at a temperature lower than 1,230° C., or an atmosphere containing water vapor as a main constituent at a temperature lower than 1,300° C., or by performing pyrogenic oxidation using oxygen and hydrogen at a temperature lower than 1,300° C. in an oxidation furnace. Also, as is apparent from the manufacturing method shown in FIGS. 2A to 2C, the sacrificial oxidation step in FIG. 3C can be performed in an atmosphere containing oxygen as a main constituent within a temperature range from 1,230° C. or more to a temperature lower than the silicon melting point or an atmosphere containing water vapor as a main constituent within a temperature range from 1,300° C. or more to a temperature lower than the silicon melting point, or by performing pyrogenic oxidation within a temperature range from 1,300° C. or more to a temperature lower than the silicon melting point.

The manufacturing method shown in FIGS. 4A to 4D will be described below.

In FIG. 4A, as in the step shown in FIG. 1A, an SOI substrate having substrate silicon 1, a buried oxide layer 2, and a surface single-crystal silicon layer 4 is formed by SIMOX or wafer bonding.

FIGS. 4B and 4C are portions characterizing the present invention. That is, in FIG. 4B, first sacrificial oxidation is performed for the SOI substrate. This first sacrificial oxidation is performed in an atmosphere containing oxygen as a main constituent within a temperature range from 1,230° C. or more to a temperature lower than the melting point of silicon or an atmosphere containing water vapor as a main constituent within a temperature range from 1,300° C. or more to a temperature lower than the silicon melting point, or by performing pyrogenic oxidation within a temperature range from 1,300° C. or more to a temperature lower than the silicon melting point. Consequently, the surface single-crystal silicon layer 4 is partially oxidized to form a surface thermal oxide layer 11. This first sacrificial oxidation is performed in a high-temperature region in which interstitial silicon atoms produced in the sacrificial oxidation step are thermochemically hard to be captured by stacking fault production nuclei. Note that the substrate silicon 1 is also partially oxidized to form a surface thermal oxide layer 12 by this sacrificial oxidation. However, this portion has no connection with the present invention.

It is also possible to perform the first sacrificial oxidation in an atmosphere containing oxygen as a main constituent at a temperature lower than 1,230° C., or an atmosphere containing water vapor as a main constituent at a temperature lower than 1,300° C., or by performing pyrogenic oxidation at a temperature lower than 1,300° C. and subsequently performing annealing as a high-temperature heat treatment in an atmosphere containing an inert gas as a main constituent within a temperature range from 1,230° C. or more to a temperature lower than the melting point of silicon. The annealing temperature can be changed during the treatment as long as the temperature is 1,230° C. or higher. The purpose of this annealing is to set a high temperature at which interstitial silicon atoms are thermochemically hard to be kept captured by stacking faults or stacking fault production nuclei, and thereby eliminate stacking faults formed in the surface single-crystal silicon layer by the sacrificial oxidation.

In FIG. 4C, second sacrificial oxidation for the surface single-crystal silicon layer 4 is performed in an atmosphere containing oxygen as a main constituent at a temperature lower than 1,230° C., or an atmosphere containing water vapor as a main constituent at a temperature lower than 1,300° C., or by performing pyrogenic oxidation at a temperature lower than 1,300° C. As a consequence, the rate of the second sacrificial oxidation becomes lower than the rate of the first sacrificial oxidation. This decreases the number of interstitial silicon atoms released in the surface single-crystal silicon layer 4 per unit time during the second sacrificial oxidation, and prevents the occurrence of stacking faults.

As described above, the second sacrificial oxidation is performed subsequently to the first sacrificial oxidation to further partially oxidize the surface single-crystal silicon layer 4. Consequently, the thickness of the surface thermal oxide layer 11 can be increased. The total thickness of this surface oxide layer is controlled so that the thickness of the residual surface single-crystal silicon layer 4 has a desired value.

In FIG. 4D, the surface thermal oxide layers 11 and 12 are removed. Thereafter, transistors or LSI devices are fabricated in the SOI substrate. The fabrication of the transistors or the LSI devices is done following the same procedure as in the manufacturing method shown in FIGS. 1A to 1D.

As is apparent from the manufacturing method shown in FIGS. 2A to 2C, the second sacrificial oxidation of FIG. 4C can also be performed in an atmosphere containing oxygen as a main constituent within a temperature range from 1,230° C. or more to a temperature lower than the silicon melting point or an atmosphere containing water vapor as a main constituent within a temperature range from 1,300° C. or more to a temperature lower than the silicon melting point, or by performing pyrogenic oxidation within a temperature range from 1,300° C. or more to a temperature lower than the silicon melting point.

The manufacturing method shown in FIGS. 5A to 5D will be described below.

In FIG. 5A, as in the step shown in FIG. 1A, an SOI substrate having substrate silicon 1, a buried oxide layer 2, and a surface single-crystal silicon layer 4 is formed by SIMOX or wafer bonding.

Figure 5B:
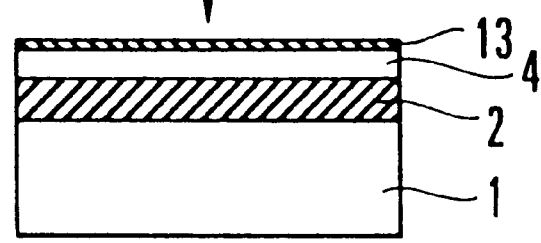

In FIG. 5B, a silicon oxide layer is deposited on this SOI substrate by chemical vapor deposition, forming a silicon oxide layer 13.

Figure 5C:
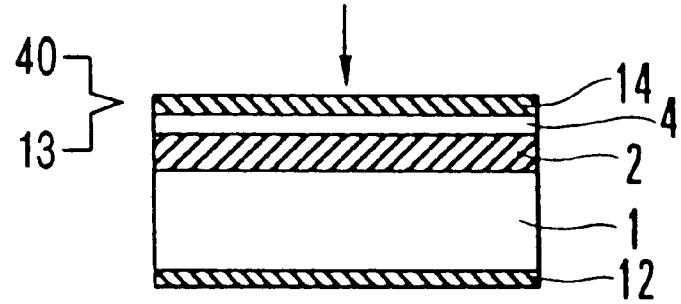

In FIG. 5C, sacrificial oxidation for the surface single-crystal silicon layer 4 is performed in an atmosphere containing oxygen as a main constituent at a temperature lower than 1,230° C., or an atmosphere containing water vapor as a main constituent at a temperature lower than 1,300° C., or by performing pyrogenic oxidation at a temperature lower than 1,300° C. As a consequence, it is possible to decrease the number of interstitial silicon atoms released in the surface single-crystal silicon layer 4 per unit time during the sacrificial oxidation, and prevent the occurrence of stacking faults. Note that the substrate silicon 1 is also partially oxidized to form a surface thermal oxide layer 12 by this sacrificial oxidation. However, this portion has no connection with the present invention.

Consequently, the surface single-crystal silicon layer 4 is partially oxidized, the thickness of the silicon oxide layer 13 on the surface of the SOI substrate is increased by silicon oxide layer 40, the thickness of the residual surface single-crystal silicon layer 4 is set to a desired value, and a silicon oxide layer 14 is formed.

Figure 5D:
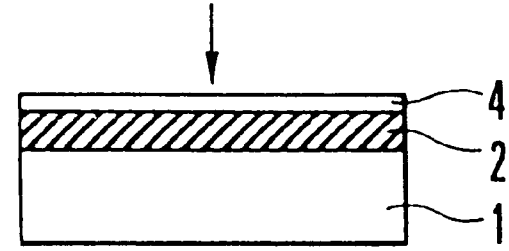
Figure 6A:
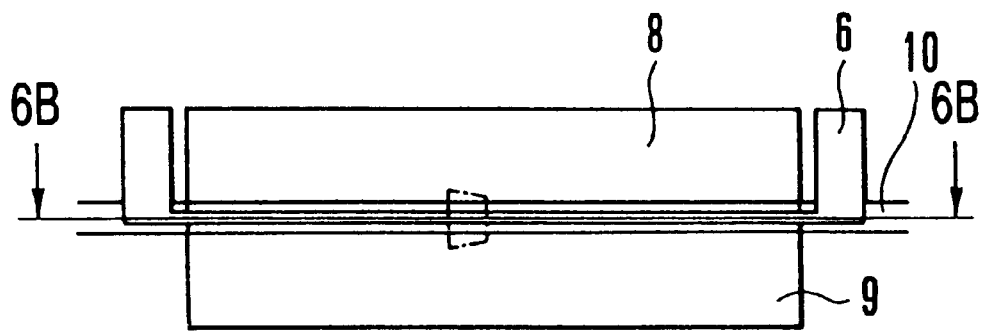
FIG. 6A is a view for explaining a planar structure of a MOS transistor with a gate length of 0.25 μm.
Figure 6B:
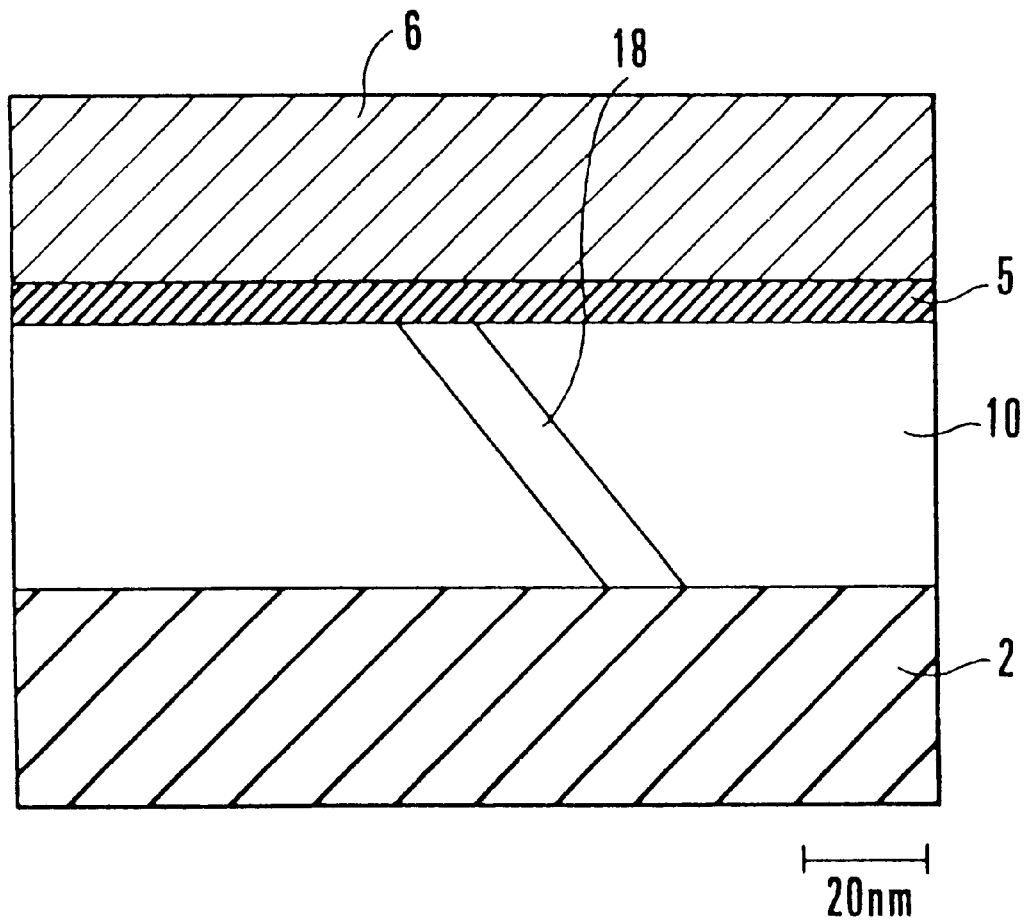
FIG. 6B is a partial sectional view of a region where a stacking fault is formed taken along a line 6B—6B in FIG. 6A.

In FIG. 5D, the surface thermal oxide layer 12 and the silicon oxide layer 14 are removed. Thereafter, MOS transistors or LSI devices are fabricated in the SOI substrate. The fabrication of the MOS transistors or the LSI devices is done following the same procedure as in the manufacturing method shown in FIGS. 1A to 1D.

As is apparent from the manufacturing method shown in FIGS. 2A to 2C, the sacrificial oxidation of FIG. 5C also be performed in an atmosphere containing oxygen as a main constituent within a temperature range from 1,230° C. or more to a temperature lower than the silicon melting point or an atmosphere containing water vapor as a main constituent within a temperature range from 1,300° C. or more to a temperature lower than the silicon melting point, or by performing pyrogenic oxidation within a temperature range from 1,300° C. or more to a temperature lower than the silicon melting point.

EXAMPLES

Experimental examples using the manufacturing methods shown in FIGS. 1A to 1D, 2A to 2C, 3A to 3D, 4A to 4D, and 5A to 5D will be described below.

[Experimental example using manufacturing method shown in FIGS. 1A to 1D]

(1) SOI substrate manufacturing step: SIMOX substrates 150 mm in diameter were used. Oxygen ions were implanted into a single-crystal silicon substrate at a dose of $4 \times 10^{17}$ cm$^{-2}$ and an acceleration energy of 180 keV. Thereafter, annealing was performed at 1,350° C. for about 4 hr in an atmosphere formed by adding about 0.5% of oxygen to argon, thereby forming a buried oxide layer 2. Furthermore, the oxide layer formed on the substrate surface during the annealing was removed to realize a structure having a surface single-crystal silicon layer 4, the buried oxide layer 2, and substrate silicon 1 in this order from the substrate surface.

(2) Sacrificial oxidation step: The SOI substrates were loaded into a vertical electric furnace as an oxidation furnace at 750° C. The temperature in the furnace including the SOI substrates was raised to 1,150° C., and the substrates were oxidized in a 100% oxygen atmosphere. Note that the loading and the heating were performed in a nitrogen atmosphere containing 10% of oxygen. After the oxidation, a 100% nitrogen atmosphere was formed in the furnace, the temperature was lowered to 750° C., and the substrates were removed from the furnace. The film thickness of surface thermal oxide layers 11 and 12 was 237 nm, and the film thickness of the residual surface single-crystal silicon layer 4 was 62 nm.

(3) High-temperature annealing step: A vertical electric furnace having a silicon carbide susceptor and a furnace body was used to anneal the substrates at 1,350° C. for about 4 hr in an argon atmosphere containing about 0.5% of oxygen. The substrates were loaded and unloaded at 850° C.

(4) Oxide layer removal step: The surface thermal oxide layers 11 and 12 were removed by using a solution mixture of ammonium fluoride and hydrofluoric acid or a dilute solution of hydrofluoric acid.

The electrical characteristics of a MOS transistor set (a device in which approximately 20,000 MOS transistors were connected parallel to each other) formed in the SOI substrate heat-treated as above were as follows.

Figure 8A:
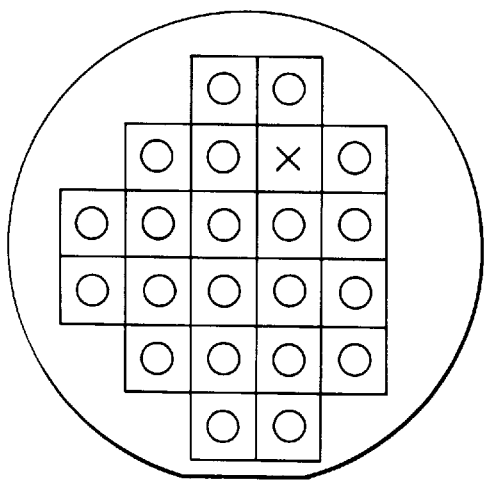
FIGS. 8A to 8C are views for explaining a MOS transistor set as examples of in-plane distributions in SOI substrates.

(5) S/D leakage current: FIG. 8A shows an example of the in-plane distribution, in an SOI substrate, of MOS transistor sets having normal drain current-drain voltage characteristics according to the present invention. In FIG. 8A, "o" indicates a MOS transistor set showing the normal drain current-drain voltage characteristics. "x" indicates a MOS transistor set which generated an abnormally large S/D leakage current.

Figure 8B:
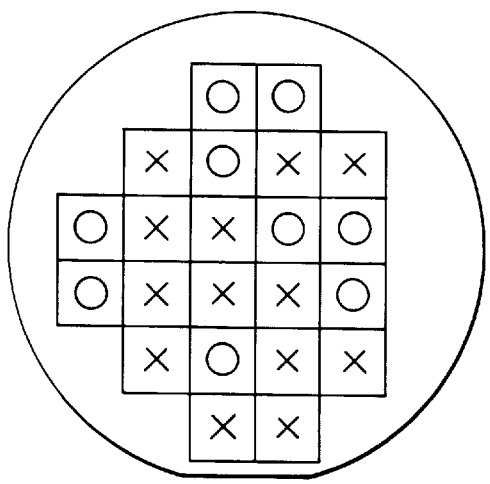

FIG. 8B shows an example of the in-plane distribution, in an SOI substrate, of MOS transistor sets having normal drain current-drain voltage characteristics when only the high-temperature annealing was not performed in step (3). The symbols in FIG. 8B have the same meanings as in FIG. 8A.

Comparing FIG. 8A with FIG. 8B reveals that the number of normal MOS transistor sets in FIG. 8A is much larger than that in FIG. 8B. That is, when the present invention is applied as a heat treatment method of controlling the film thickness of the surface single-crystal silicon layer 4, it is possible to greatly reduce the S/D leakage current and improve the yield of devices.

Figure 7:
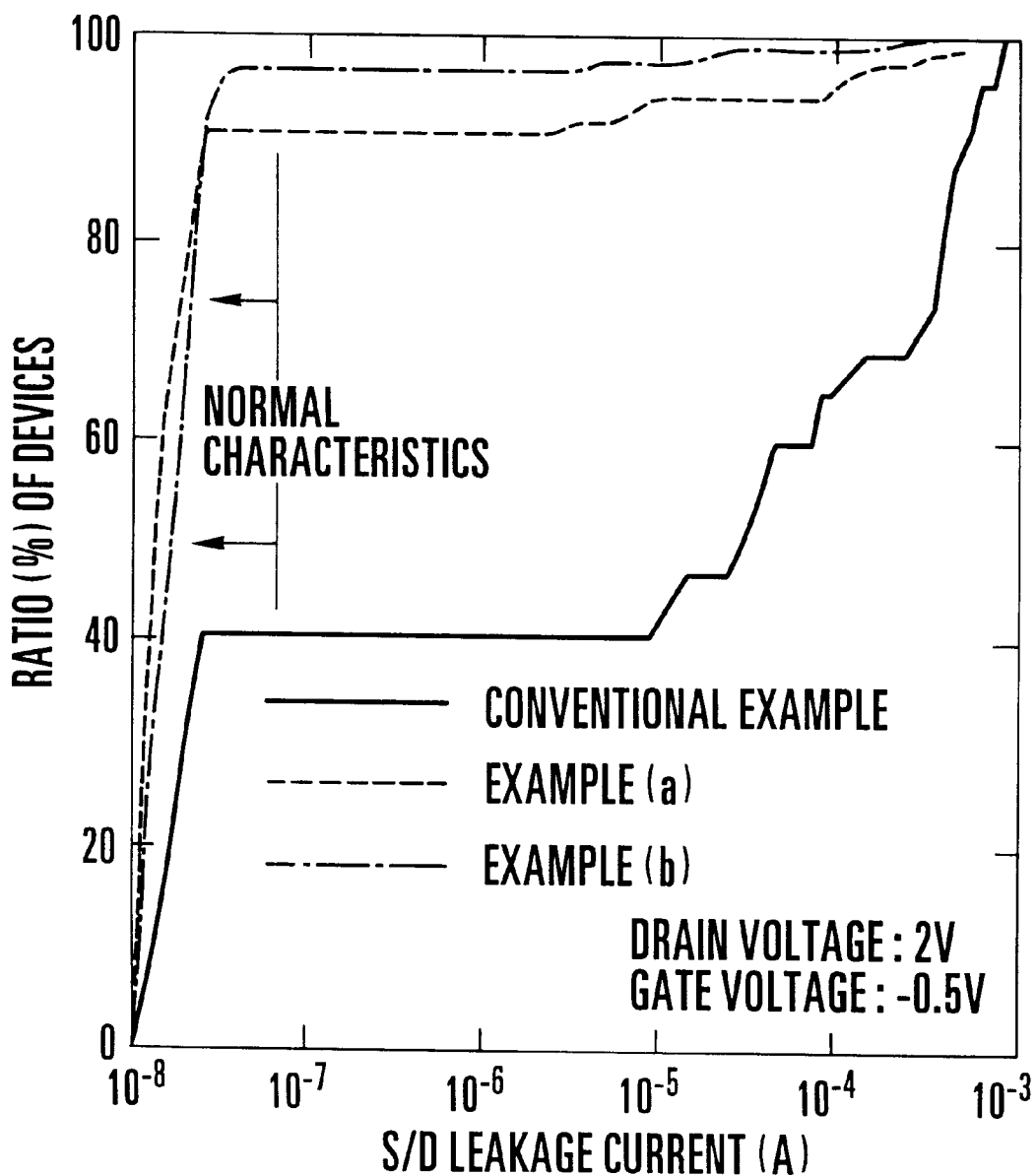
FIG. 7 is a graph in which the value of an S/D leakage current of a device is plotted on the abscissa and the ratio of devices indicating current values smaller than this S/D leakage current value is plotted on the ordinate, when drain current $V_D$=2 (V) and gate voltage $V_G$=−0.5 (V)

FIG. 7 shows a graph in which the S/D leakage current value of the devices fabricated in this example is plotted on the abscissa and the ratio of devices indicating smaller current values than this S/D leakage current value is plotted on the ordinate, when drain voltage $V_D$=2 V and gate voltage $V_G$=–0.5 V. As is apparent from FIG. 7, the ratio of devices indicating abnormally large S/D leakage currents in this example (a) (indicated by the broken line) is much smaller than that of devices (indicated by the solid line) fabricated by a conventional heat treatment method.

(6) Stacking faults: The presence/absence of stacking faults in the surface single-crystal silicon layer 4 of the SOI substrates manufactured by the manufacturing steps shown in FIGS. 1A to 1D was evaluated by the following procedure, thereby confirming that stacking faults were completely removed from the surface single-crystal silicon layer 4. That is, after the oxide layers were removed in step (4), an epitaxial silicon layer about 1 $\mu$m thick was grown at 1,050° C. on the surface single-crystal silicon layer by using a chemical-vapor-deposition furnace. Thereafter, the surface single-crystal silicon layer was partially etched (the etched film thickness was about 0.5 $\mu$m) by using a chemical etching solution consisting of hydrofluoric acid:nitric acid:acetic acid:deionized water at a volume ratio of 2:15:2:4, and the density of stacking faults was measured. The measurement was done by using an optical microscope.

Consequently, no etch pits (if a stacking fault exists, an etch pit is formed in that region) resulting from stacking faults were observed. That is, it was confirmed, as described above, that stacking faults completely disappeared in the surface single-crystal silicon layer 4. The stacking fault density was similarly evaluated for an SOI substrate manufactured by the same manufacturing steps as above except that the high-temperature annealing in step (3) was not performed. Consequently, stacking faults existed at a high density of 600 to 1,000 faults/cm$^2$.

[Experimental example using the manufacturing method shown in FIGS. 2A to 2C]

(1) SOI substrate manufacturing step: SIMOX substrates manufactured following the same procedure as in the experimental example using the manufacturing steps of the manufacturing method shown in FIGS. 1A to 1D were used.

(2) Sacrificial oxidation step: A vertical electric furnace having a silicon carbide susceptor and a furnace body was used, and the SOI substrates were loaded into this oxidation furnace at 850° C. The temperature in the furnace including the SOI substrates was raised to 1,350° C., and the substrates were oxidized in an atmosphere containing about 70% of oxygen and about 30% of argon and subsequently in a 100% oxygen atmosphere for a total of about 6 hr. After the oxidation, the temperature in the furnace was lowered to 850° C., and the substrate was removed from the furnace. The film thickness of surface thermal oxide layers 11 and 12 was 640 nm, and the film thickness of a residual surface single-crystal silicon layer 4 was 62 nm.

(3) Oxide layer removal step: The surface thermal oxide layers 11 and 12 were removed by using a solution mixture of ammonium fluoride and hydrofluoric acid or a dilute solution of hydrofluoric acid.

The electrical characteristics of a MOS transistor set (a device in which approximately 20,000 MOS transistors were connected parallel to each other) formed in the SOI substrate heat-treated as above were as follows.

Figure 8C:
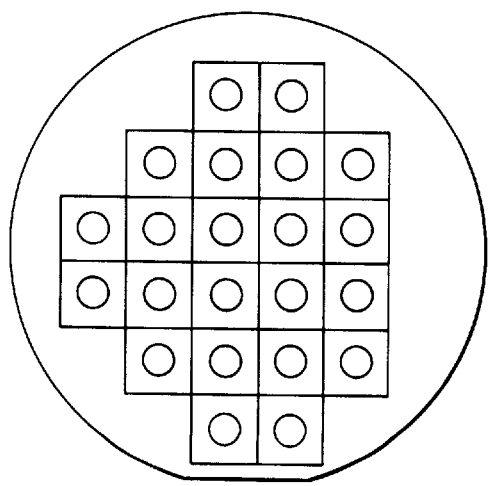
Figure 9:
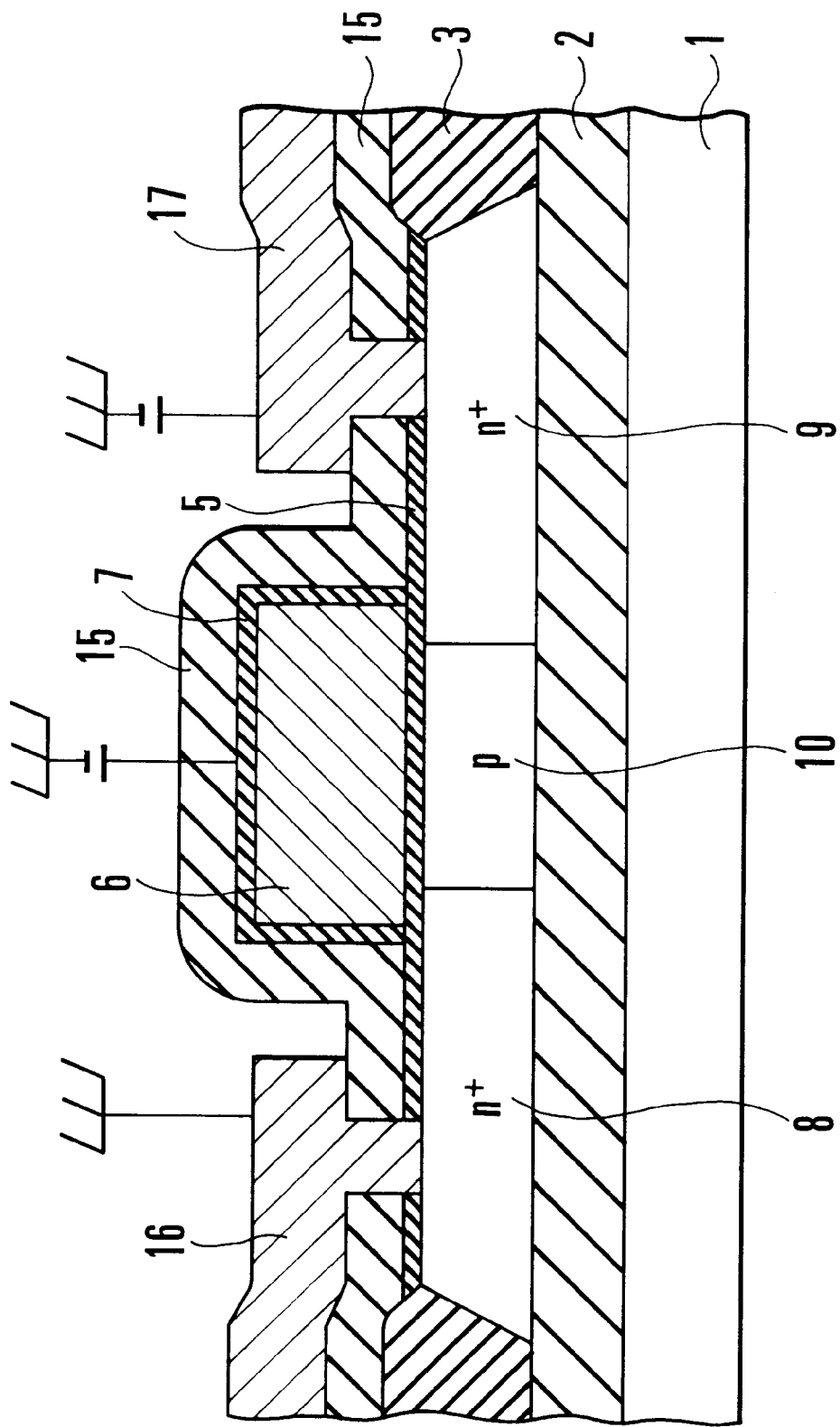
FIG. 9 is a sectional view showing the structure of an n-type MOS transistor fabricated in a surface single-crystal silicon substrate of a SIMOX substrate.

(4) S/D leakage current: FIG. 8C shows an example of the in-plane distribution, in an SOI substrate, of MOS transistor sets having normal drain current-drain voltage characteristics according to the present invention. The symbols in FIG. 8C have the same meanings as in FIG. 8A.

Comparing FIG. 8C with FIG. 8B reveals that the number of normal MOS transistor sets in FIG. 8C is much larger than that in FIG. 8B. That is, when the present invention is applied as a heat treatment method of controlling the film thickness of the surface single-crystal silicon layer 4, it is possible to greatly reduce the S/D leakage current and improve the yield of devices.

Also, as is apparent from FIG. 7, the ratio of devices indicating abnormally large S/D leakage currents in this example (FIGS. 2A to 2C; indicated by the alternate long and short dashed line) is much smaller than that of devices (indicated by the solid line) fabricated by a conventional heat treatment method.

(5) Stacking faults: The presence/absence of stacking faults in the surface single-crystal silicon layer 4 of the SOI substrates manufactured by the manufacturing method shown in FIGS. 2A to 2C was evaluated following the same procedure as in the experimental example using the manufacturing method shown in FIGS. 1A to 1D. Consequently, it was confirmed that no stacking faults were formed in the surface single-crystal silicon layer.

[Experimental example using manufacturing method shown in FIGS. 3A to 3D]

(1) SOI substrate manufacturing step: SIMOX substrates manufactured following the same procedure as in the experimental example using the manufacturing method shown in FIGS. 1A to 1D were used.

(2) Hydrogen annealing step: the SIMOX substrates were loaded onto a silicon carbide susceptor in a hydrogen treatment furnace at room temperature. Thereafter, the temperature was raised to 1,100° C., and the substrates were annealed by holding it in a hydrogen atmosphere for 30 min.

(3) Sacrificial oxidation step: The same vertical electric furnace as used in the sacrificial oxidation in the manufacturing method shown in FIGS. 1A to 1D was used to perform sacrificial oxidation under the same conditions. The film thickness of surface thermal oxide layers 11 and 12 was 237 nm, and the film thickness of a residual surface single-crystal silicon layer 4 was 60 nm.

(4) Oxide layer removal step: The surface thermal oxide layers 11 and 12 were removed by using a solution mixture of ammonium fluoride and hydrofluoric acid or a dilute solution of hydrofluoric acid.

(5) Stacking faults: The presence/absence of stacking faults in the surface single-crystal silicon layer 4 of the SOI substrates manufactured by the manufacturing method shown in FIGS. 3A to 3D was evaluated following the same procedure as in the experimental example using the manufacturing method shown in FIGS. 1A to 1D. The results are shown in Table 1. For comparison, Table 1 also shows the stacking fault density in a surface single-crystal silicon layer 4 of a substrate manufactured by the same manufacturing steps except that only hydrogen annealing was not performed.

As can be seen from Table 1, when the present invention was applied, it was possible to reduce the number of stacking faults in the surface single-crystal silicon layer 4 to about 1/10 of the conventional value when hydrogen annealing was performed at 1,000° C. for 30 min, and to about 1/30 the conventional value when hydrogen annealing was performed at 1,100° C. for 30 min. Furthermore, when hydrogen annealing was performed at 1,100° C. for 120 min, it was possible to almost completely prevent the occurrence of stacking faults. It was confirmed by analysis using an atomic force microscope that the degree of unevenness of the surface single-crystal silicon layer 4 was improved by about 20% by hydrogen annealing. On the other hand, when hydrogen annealing was performed at 900° C. for 30 min, the stacking fault density was 500 to 800 faults/cm$^2$. That is, at 900° C. or lower, almost no stacking fault density reducing effect of hydrogen annealing was found.

TABLE 1

| Hydrogen annealing | Stacking fault density (faults/cm$^2$) |
| --- | --- |
| Not performed | 600 to 1,000 |
| Performed (900° C., 30 min) | 500 to 800 |
| Performed (1,000° C., 30 min) | 60 to 110 |
| Performed (1,050° C., 30 min) | 50 to 90 |
| Performed (1,100° C., 30 min) | 20 to 40 |
| Performed (1,100° C., 120 min) | <20 |

[Experimental example using manufacturing method shown in FIGS. 4A to 4D]

(1) SOI substrate manufacturing step: SIMOX substrates manufactured following the same procedure as in the experimental example using the manufacturing method shown in FIGS. 1A to 1D were used.

(2) First sacrificial oxidation step: A vertical electric furnace having a silicon carbide susceptor and a furnace body was used, and the SOI substrates were loaded into this oxidation furnace at 850° C. The temperature in the furnace including the SOI substrates was raised to 1,350° C., and the substrates were oxidized in an atmosphere containing about 70% of oxygen and about 30% of argon for about 3 hr. After the oxidation, the temperature in the furnace was lowered to 850° C., and the substrates were removed from the furnace. The film thickness of surface thermal oxide layers 11 and 12 was 430 nm.

(3) Second sacrificial oxidation step: The same vertical electric furnace as used in the sacrificial oxidation in the manufacturing method shown in FIGS. 1A to 1D was used to perform sacrificial oxidation at 1,100° C. for about 12 hr. The film thickness of the surface thermal oxide layers 11 and 12 was 640 nm, and the film thickness of a residual surface single-crystal silicon layer 4 was 62 nm. Note that the maximum value of the oxidation rate of the surface single-crystal silicon layer 4 could be decreased by not less than one order of magnitude compared to that when the first sacrificial oxidation was not performed.

(4) Oxide layer removal step: The surface thermal oxide layers 11 and 12 were removed by using a solution mixture of ammonium fluoride and hydrofluoric acid or a dilute solution of hydrofluoric acid.

(5) Stacking faults: The presence/absence of stacking faults in the surface single-crystal silicon layer 4 of the SOI substrates manufactured by the manufacturing method shown in FIGS. 4A to 4D was evaluated following the same procedure as in the experimental example using the manufacturing method shown in FIGS. 1A to 1D. The result was that the stacking fault density was less than 20 faults/cm$^2$, i.e., it was possible to almost completely prevent the occurrence of stacking faults.

[Experimental example using manufacturing method shown in FIGS. 5A to 5D]

(1) SOI substrate manufacturing step: SIMOX substrates manufactured following the same procedure as in the experimental example using the manufacturing method shown in FIGS. 1A to 1D were used.

(2) Oxide layer deposition: A silicon oxide layer 13 about 400 nm thick was deposited at 730° C. on the SIMOX substrates by using a low-pressure chemical-vapor-deposition furnace.

(3) Sacrificial oxidation step: The same vertical electric furnace as used in the sacrificial oxidation in the manufacturing method shown in FIGS. 1A to 1D was used to perform sacrificial oxidation at 1,100° C. for about 12 hr.

(4) Oxide layer removal step: A surface thermal oxide layer 12 and a silicon oxide layer 14 were removed by using a solution mixture of ammonium fluoride and hydrofluoric acid or a dilute solution of hydrofluoric acid.

(5) Stacking faults: The presence/absence of stacking faults in the surface single-crystal silicon layer 4 of the SOI substrates manufactured by the manufacturing method shown in FIGS. 5A to 5D was evaluated following the same procedure as in the experimental example using the manufacturing method shown in FIGS. 1A to 1D. The result was that the stacking fault density was less than 20 faults/cm$^2$, i.e., it was possible to almost completely prevent the occurrence of stacking faults. Note that the present invention has the advantage that no special high-temperature annealing furnace is required in the sacrificial oxidation step.

As has been described above, when the SOI substrate manufacturing method according to the present invention is used, it is possible to eliminate stacking faults formed when sacrificial oxidation is performed and thereby largely reduce the source-drain leakage current of an MOS transistor formed in a single-crystal silicon layer on an oxide layer.

What is claimed is:

1. A method of manufacturing an SOI substrate, comprising the steps of:
   using an SOI substrate having a first single-crystal silicon layer, an insulating layer formed on said first single-crystal silicon layer, and a second single-crystal silicon layer formed on said insulating layer,
   thermally oxidizing a surface of said second single crystal silicon layer; and
   controlling said second single-crystal silicon layer to have a predetermined thickness by removing the thermally oxidized silicon,
   wherein the step of controlling said second single-crystal silicon layer to have a predetermined thickness comprises the step of eliminating, by annealing, stacking faults formed by the thermal oxidation.

2. A method according to claim 1, wherein the elimination step is executed after the thermal oxidation step.

3. A method according to claim 2, wherein the elimination step is performed in an atmosphere containing an inert gas as a main constituent within a temperature range of not less than 1,230° C. to a temperature lower than a melting point of silicon.

4. A method according to claim 1, wherein the elimination step is included in the thermal oxidation step and performed in an atmosphere containing dry oxygen as a main constituent within a temperature range of not less than 1,230° C. to a temperature lower than a melting point of silicon.

5. A method according to claim 1, wherein the elimination step is included in the thermal oxidation step and performed in an atmosphere containing water vapor as a main constituent within a temperature range of not less than 1,300° C. to a temperature lower than a melting point of silicon.

6. A method according to claim 1, wherein the elimination step is performed in an atmosphere in which oxygen and hydrogen are burned within a temperature range of not less than 1,300° C. to a temperature lower than a melting point of silicon.

7. A method according to claim 1, wherein the elimination step is executed before the thermal oxidation step in an atmosphere containing hydrogen as a main constituent within a temperature range of not less than 1,000° C. to a temperature lower than a melting point of silicon.

8. A method according to claim 1, wherein the elimination step comprises an additional thermal oxidation step after the thermal oxidation step.

9. A method according to claim 8, wherein the additional thermal oxidation step is performed in an atmosphere containing dry oxygen as a main constituent at a temperature lower than 1,230° C.

10. A method according to claim 8, wherein the additional thermal oxidation step is performed in an atmosphere containing water vapor as a main constituent at a temperature lower than 1,300° C.

11. A method according to claim 8, wherein the additional thermal oxidation step is performed in an atmosphere in which oxygen and hydrogen are burned at a temperature lower than 1,300° C.

12. A method according to claim 1, wherein the elimination step is the step of depositing a silicon oxide layer, which is executed before the thermal oxidation step.

* * * * *

UNITED STATES PATENT AND TRADEMARK OFFICE
CERTIFICATE OF CORRECTION

PATENT NO. : 5,989,981
DATED : November 23, 1999
INVENTOR(S) : Nakashima et al.

It is certified that error appears in the above-identified patent and that said Letters Patent is hereby corrected as shown below:

In column 5, line 2, delete "according to till another" and insert -- according to still another --.

In column 9, line 31, delete "oxidation of FIG. 5C also be" and insert -- oxidation of FIG. 5C can also be --.

Signed and Sealed this

Tenth Day of April, 2001

Attest:

NICHOLAS P. GODICI

Attesting Officer

Acting Director of the United States Patent and Trademark Office